(12) United States Patent
Kitano et al.

(10) Patent No.: US 7,136,672 B2
(45) Date of Patent: Nov. 14, 2006

(54) MOBILE TELEPHONE WITH BUILT-IN CAMERA AND FLASH

(75) Inventors: Masaharu Kitano, Kitakatsuragi-gun (JP); Sadao Nakamura, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 149 days.

(21) Appl. No.: 10/437,907

(22) Filed: May 15, 2003

(65) Prior Publication Data

US 2003/0216151 A1 Nov. 20, 2003

(30) Foreign Application Priority Data

May 15, 2002 (JP) .............................. 2002-140398

(51) Int. Cl.
*H04M 1/00* (2006.01)
*G03B 15/03* (2006.01)

(52) U.S. Cl. ................ 455/556.1; 455/567; 455/159.1; 455/159.2; 396/4; 396/155; 396/176; 396/182; 396/429

(58) Field of Classification Search ............. 455/556.1, 455/557, 567, 159.1, 159.2; 396/4, 155, 396/176, 182, 420; 362/3; 348/68, 70
See application file for complete search history.

(56) References Cited

U.S. PATENT DOCUMENTS

| | | | | |
|---|---|---|---|---|
| 4,884,133 A | * | 11/1989 | Kanno et al. ................ 348/68 |
| 5,339,159 A | * | 8/1994 | Nakamura et al. ............. 348/71 |
| 5,374,988 A | * | 12/1994 | Wertz et al. ................ 356/328 |
| 5,523,786 A | * | 6/1996 | Parulski ..................... 348/269 |
| 5,831,686 A | * | 11/1998 | Beretta ...................... 348/602 |
| 6,031,655 A | * | 2/2000 | Yagyu ........................ 359/292 |
| 6,205,244 B1 | * | 3/2001 | Bawolek et al. ............. 382/162 |
| 6,347,189 B1 | * | 2/2002 | Hosokawa et al. ............ 396/62 |
| 6,377,818 B1 | * | 4/2002 | Irube et al. ............... 455/556.1 |
| 6,449,006 B1 | * | 9/2002 | Shipp ........................ 348/70 |
| 6,577,378 B1 | * | 6/2003 | Gallagher et al. ............ 355/35 |
| 6,710,809 B1 | * | 3/2004 | Niikawa ..................... 348/372 |
| 2002/0051642 A1 | * | 5/2002 | Hicks ........................ 396/429 |
| 2002/0142798 A1 | * | 10/2002 | Miyake ...................... 455/556 |
| 2002/0142810 A1 | * | 10/2002 | Kawasaki et al. ........... 455/566 |
| 2002/0147033 A1 | * | 10/2002 | Ban et al. .................. 455/566 |
| 2003/0013484 A1 | * | 1/2003 | Nishimura et al. ......... 455/556 |
| 2003/0052964 A1 | * | 3/2003 | Priestman et al. ....... 348/14.02 |
| 2003/0212918 A1 | * | 11/2003 | D'Angelo et al. .......... 713/500 |
| 2004/0078299 A1 | * | 4/2004 | Down-Logan et al. ........ 705/27 |
| 2004/0223063 A1 | * | 11/2004 | DeLuca et al. ............. 348/239 |

FOREIGN PATENT DOCUMENTS

JP 11-112953 A 4/1999
KR 2003054947 A * 7/2003

* cited by examiner

*Primary Examiner*—George Eng
*Assistant Examiner*—Huy Phan
(74) *Attorney, Agent, or Firm*—Birch, Stewart, Kolasch & Birch, LLP (57) ABSTRACT

A mobile telephone quipped with a camera may employ, as a camera flash, one or more RGB tri-color LEDs arranged on a face of the mobile telephone which is aligned with the direction in which a photograph may be taken by the camera. The viewing angle of the RGB tri-color LED may be greater than the field angle of the camera, and a lens may be arranged in front of emitting portion(s) of the RGB tri-color LED so as to cause illuminance to be uniform within the field angle of the camera. The RGB tri-color LED may also serve as an indicator of telephone functions.

13 Claims, 3 Drawing Sheets

MOBILE TELEPHONE WITH BUILT-IN CAMERA AND FLASH

BACKGROUND OF INVENTION (1) Field of Invention

The present invention pertains to a mobile telephone equipped with an incoming call indicator lamp, a camera, and a camera flash; in particular, the present invention concerns a mobile telephone employing light emitting diode (s) (hereinafter simply "LED(s)") as incoming call indicator lamp and camera flash.

(2) Conventional Art

Examples of conventional mobile telephones include a mobile telephone having a built-in camera which is manufactured by Toshiba Corp. for J-PHONE (an abbreviation of J-PHONE Co., Ltd.), and while this mobile telephone is supplied with a flash, the form which this takes is such that the flash must be attached externally to a location provided on the mobile telephone body for connection of a headphone.

Furthermore, another example of a conventional mobile telephone is a mobile telephone provided by cdmaOne (a digital mobile telephone service provided by DDI Cellular Group and IDO), digital cameras for this mobile telephone including a digital camera manufactured by Kyocera Corp. To be used, this digital camera must be connected to an interface of the mobile telephone, neither the camera nor the flash being built into the mobile telephone body.

Neither the flash supplied with the foregoing mobile telephone having built-in camera which is manufactured by Toshiba Corp. for J-PHONE nor the flash of the digital camera for the mobile telephone provided by cdmaOne is implemented through use of LED(s).

Furthermore, examples of devices employing LEDs as light emitting elements include the photographic apparatus and pictorial communication apparatus disclosed in Japanese Patent Application Publication Kokai No. H11-112953 (1999). In this photographic apparatus and pictorial communication apparatus, LED viewing angle is narrowed through provision of a convex lens to the front of the LED, and confirmation is carried out with respect to whether a photographic subject is present within the photographable range thereof.

Because the aforementioned conventional mobile telephones are such that a flash must be attached externally thereto or a digital camera equipped with camera and flash must be connected thereto, there has been the problem that the user must, separately from the mobile telephone, also carry a flash or a digital camera about with him or her.

Furthermore, in accordance with the method for using a lens at the photographic apparatus and pictorial communication apparatus disclosed in Japanese Patent Application Publication Kokai No. H11-112953 (1999), there has been the problem that use of a lens to narrow LED viewing angle has made it difficult for light from the LED to be made to fill the entire field angle of the camera, and there has been the problem of inability to achieve uniform LED illuminance within the field angle of the camera.

SUMMARY OF INVENTION

The present invention was conceived in order to solve problems such as these, it being an object thereof to provide a mobile telephone having a built-in camera flash.

A mobile telephone in accordance with one or more embodiments of the present invention, in the context of a mobile telephone equipped with one or more cameras, is a mobile telephone characterized in that it is further equipped with one or more LEDs; at least one of said LED or LEDs being used as a camera flash. Because such embodiment(s) of the present invention permit a mobile telephone equipped with camera(s) and camera flash(es) to be attained, the need for a user to, separately from the mobile telephone, also carry a flash or digital camera about with him or her may be eliminated.

Furthermore, at least one of the LED or LEDs may be arranged on at least one face of the mobile telephone on at least one side thereof which is in at least one direction in which one or more photographs may be taken by at least one of the camera or cameras. In accordance with such embodiment(s) of the present invention, because camera(s) and camera flash(es) always face in more or less the same direction or directions, it is possible to cause field angle(s) of camera(s) to be irradiated with light output from LED(s).

Furthermore, at least one of the LED or LEDs may also serve as incoming call indicator lamp. In accordance with such embodiment(s) of the present invention, separate provision of incoming call indicator lamp(s) is unnecessary.

Furthermore, at least one of the LED or LEDs may be an RGB tri-color LED having one or more red LED chips, one or more green LED chips, and one or more blue LED chips. In such a case it will be possible to capture color images.

Furthermore, at least one of the red LED chip or chips, at least one of the green LED chip or chips, and at least one of the blue LED chip or chips may be contained within a single package. In such a case it will be possible to achieve miniaturization.

Furthermore, an LED having a viewing angle which is greater than at least one field angle of at least one of the camera or cameras may be used as at least one of such LED or LEDs. In such a case, it will be possible during flash use to cause field angle(s) of camera(s) to be definitively irradiated with light output from LED(s).

Furthermore, at least one lens may be arranged to the front of at least one light emitting portion of at least one of the LED or LEDs so as to cause illuminance of at least one of the LED or LEDs to be uniform within at least one field angle of at least one of the camera or cameras. In such a case it will be possible for capturing of images to be carried out definitively.

Furthermore, at least one of the RGB tri-color LED or LEDs may light in one or more prescribed patterns and in one or more prescribed colors as a result of selective combination of emission of light by at least one of the red LED chip or chips, at least one of the green LED chip or chips, and at least one of the blue LED chip or chips during receipt of incoming call or calls; and at least one of the RGB tri-color LED or LEDs may light as a result of substantially simultaneous emission of light by at least one of the red LED chip or chips, at least one of the green LED chip or chips, and at least one of the blue LED chip or chips during flash use.

In such a case it will be possible, through control of lighting in selectively combined fashion, to achieve desired lit state or states.

Furthermore, one end of at least one of the red LED chip or chips, one end of at least one of the green LED chip or chips, and one end of at least one of the blue LED chip or chips may be connected in parallel to one or more power supplies; and one or more sets of two switches respectively connected in series to resistors may be connected in parallel between ground and each of the other end of at least one of the red LED chip or chips, the other end of at least one of the green LED chip or chips, and the other end of at least one of the blue LED chip or chips; at least one of the RGB tri-color LED or LEDs lighting in one or more prescribed patterns and in one or more prescribed colors as a result of the respective switches being switched ON in selectively combined fashion during receipt of incoming call or calls; and at least one of the RGB ti-color LED or LEDs lighting as a result of substantially all of the switches being switched ON substantially simultaneously during flash use.

In such a case it will be possible, through control of ON and OFF states of switch(es), to achieve desired lit state or states. Furthermore, it will be possible to ensure adequate light intensity during flash use.

Furthermore, at least one of the red LED chip or chips, at least one of the green LED chip or chips, at least one of the blue LED chip or chips, and one or more tri-color simultaneous control switches may be connected in series between one or more power supplies and ground; one or more single-color control switches may be respectively connected in parallel to at least one of the chip or chips of each color; at least one of the RGB tri-color LED or LEDs lighting in one or more prescribed patterns and in one or more prescribed colors as a result of the tri-color simultaneous control switch or switches being switched ON and the respective single-color control switches being switched ON in selectively combined fashion during receipt of incoming call or calls; and at least one of the RGB tri-color LED or LEDs lighting as a result of only the tri-color simultaneous control switch or switches being switched ON during flash use.

In such a case it will be possible, through control of ON and OFF states of switch(es), to achieve desired lit state or states.

Furthermore, the current flowing through at least one of the RGB tri-color LED or LEDs during flash use may be made to be greater than the current flowing through at least one of the RGB tri-color LED or LEDs during receipt of incoming call or calls. In such a case it will be possible for capturing of images to be carried out definitively and it will be possible to ensure adequate light intensity during flash use.

DESCRIPTION OF PREFERRED EMBODIMENTS

Below, embodiments of the present invention are described with reference to the drawings.

Figure 1:
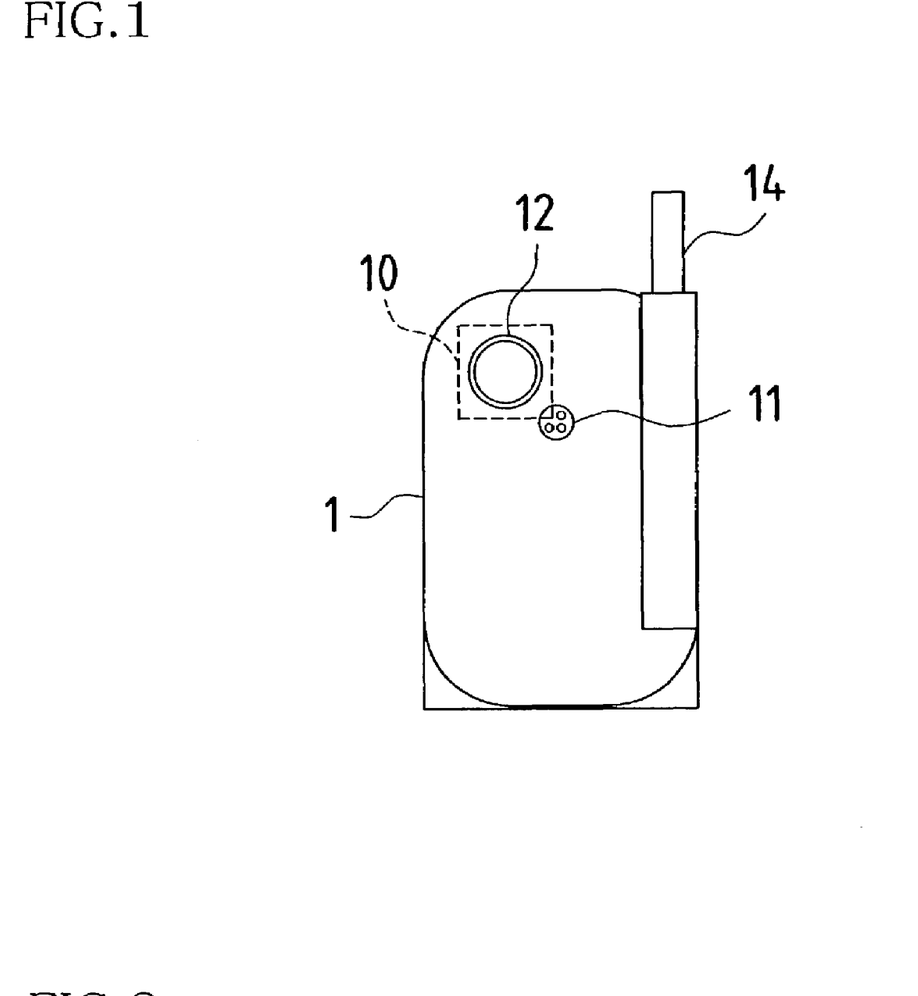
FIG. 1 is an explanatory diagram showing an embodiment of the mobile telephone of the present invention.

FIG. 1 is an explanatory diagram showing one embodiment of the mobile telephone of the present invention.

The mobile telephone of the present embodiment, being a mobile terminal for carrying out communication by way of a wireless communication network, comprises a display component 1 and an operation panel component (not shown). The mobile telephone shown being of the folding type, only the back of display component 1 is shown in the present drawing. Provided at this display component I there is an antenna 14, and there are also a number of components which are not shown in the drawing, such as a liquid crystal display panel, speaker(s), and so forth. Furthermore, provided at the operation panel component, not shown, there is an operation keypad comprising number keys, symbol keys, and function keys for use by the user when carrying out setting of various preferences, composition of electronic mail, dialing, and so forth, and there is also a microphone and various other components.

This display component 1 and this operation panel component are connected by way of a hinge or the like, permitting the liquid crystal display panel of display component 1 and the operation keypad of the operation panel component to be housed so as to face each other when in a folded state.

Furthermore, arranged at the back of display component 1 there are a camera lens 12 and an RGB tri-color LED 11 serving as incoming call indicator lamp and camera flash. That is, because RGB tri-color LED 11 and camera lens 12 are arranged at the same face of the mobile telephone (the back of display component 1 in the present case), the direction irradiated by light emitted from RGB tri-color LED 11 will always be more or less identical to the direction in which camera lens 12 faces. Moreover, arranged at the interior of display component 1 at a location directly beneath camera lens 12 there is a camera 10. While this camera 10 may be a small-package camera module incorporating, for example, a C-MOS (Complementary Metal-Oxide Semiconductor) imager, there is no limitation with respect hereto, it also being possible for same to incorporate a CCD (Charge Coupled Device). Furthermore, because the LED chip is small, having thickness on the order of 0.25 mm and external dimensions on the order of 0.3 mm×0.3 mm, it is capable of being built into the mobile telephone body. Note that "RGB" refers to the three primary colors of light, "R" being an abbreviation for "red," "G" being an abbreviation for "green," and "B" being an abbreviation for "blue," and RGB tri-color LED 11 is an LED equipped with three light sources respectively capable of outputting red light, green light, and blue light.

Furthermore, because it is impossible to arrange camera lens 12 and RGB tri-color LED 11 at the same location, the device employed as RGB tri-color LED 11 has a viewing angle which is larger than the field angle of camera lens 12; for example, if the field angle of camera lens 12 is approximately 60°, a device having a viewing angle of 120° might be employed as RGB tri-color LED 11. Moreover, because illuminance of RGB tri-color LED 11 is less intense toward the periphery as compared with the center of the irradiated region, use of an RGB tri-color LED 11 having a wide viewing angle ensures definitive irradiation of the photographable range.

Note that viewing angle refers to the angle formed between the direction in which the relative emitted luminous intensity of the LED is at its peak luminous intensity value (the optical axis) and a direction in which the luminous intensity thereof is reduced to some prescribed value; in particular, the angle formed relative to the optical axis at a location where this prescribed value is 50% of the peak value is called the viewing half value angle. The smaller the viewing half value angle the narrower the directivity will be. Furthermore, field angle refers to the range which can be captured by a camera, this range varying according to differences in camera lens focal length, the smaller the focal length of the camera lens the greater being the field angle thereof; and for identical camera lens focal lengths, cameras comprising larger image sensors will have wider field angles.

In addition, in order to eliminate nonuniformity in illuminance of RGB tri-color LED 11, the shape of the resin used to encapsulate the LED chip at RGB tri-color LED 11 may be adjusted or a lens 13 for adjusting directional characteristics may be provided separately from RGB tri-color LED 11, this then being attached to the front of RGB tri-color LED 11.

Figure 2:
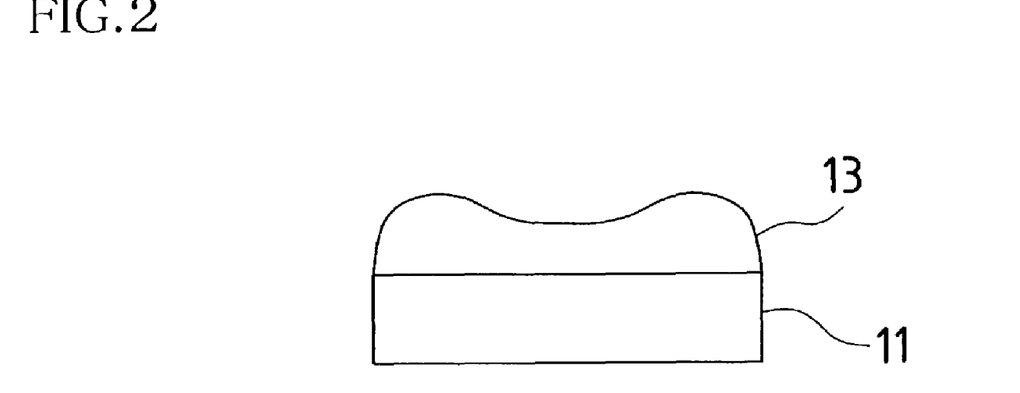
FIG. 2 is schematic sectional diagram showing an example of a lens for adjusting directional characteristics which may be attached to the front of an RGB tri-color LED serving as component in the mobile telephone shown in FIG. 1.

FIG. 2 is schematic sectional diagram showing an example of a lens 13 for adjusting directional characteristics which may be attached to the front of an RGB tri-color LED 11 serving as component in the mobile telephone shown in FIG. 1.

In order for lens 13 for adjusting directional characteristics which is attached to the front of RGB tri-color LED 11 to increase illuminance at the periphery of the region irradiated by RGB tri-color LED 11, this takes the form of an aspheric lens of shape such that thickness at the periphery is greater relative to the center than would be the case for a regular spherical lens.

Figure 3:
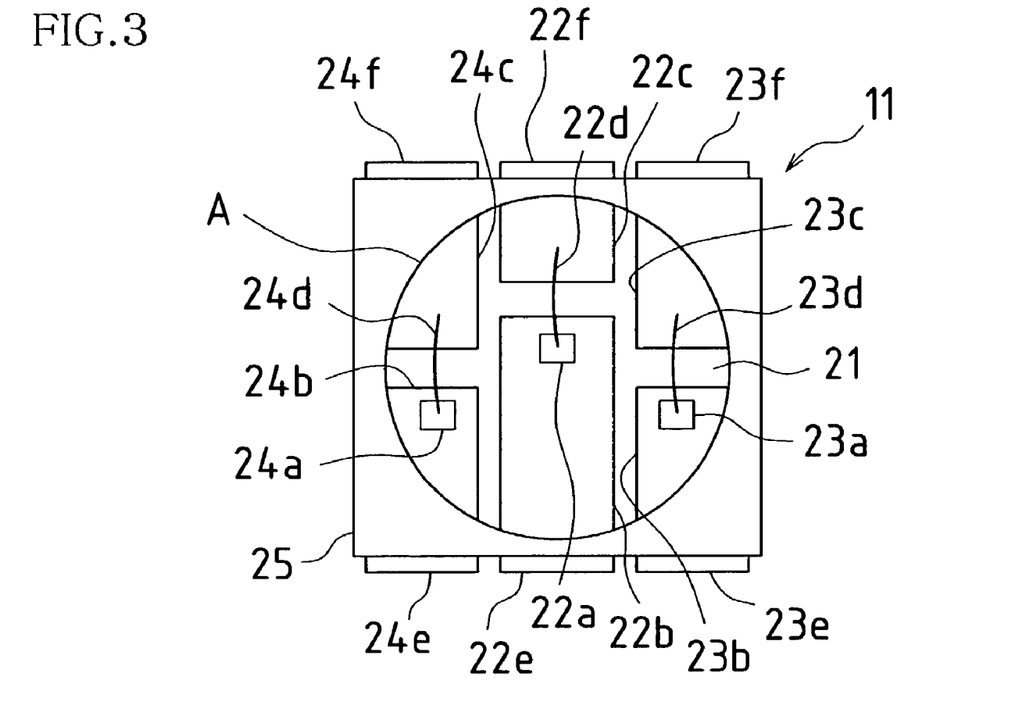
FIG. 3 is an enlarged plan view showing an example of an RGB tri-color LED serving as component in the mobile telephone shown in FIG. 1.
Figure 4:
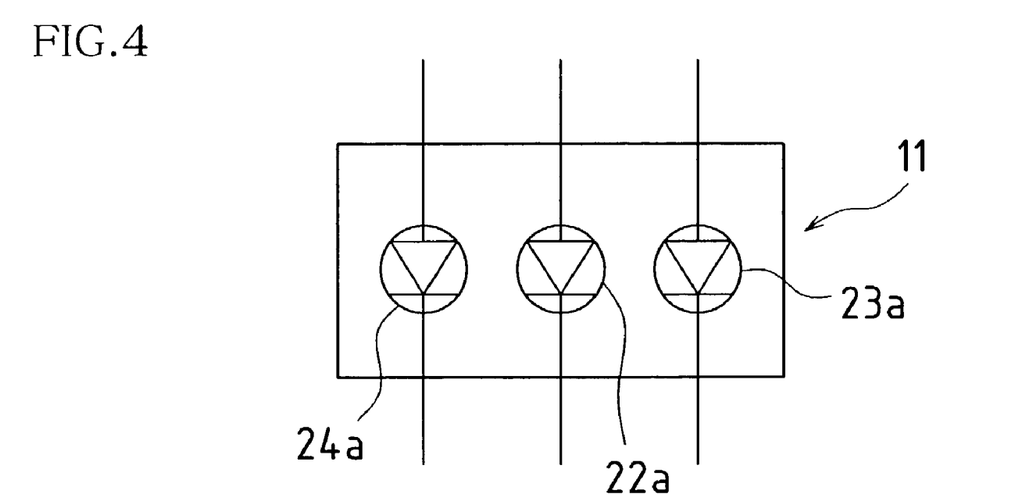
FIG. 4 is an explanatory diagram showing an exemplary arrangement of the RGB tri-color LED shown in FIG. 3.

FIG. 3 is an enlarged plan view showing an example of an RGB tri-color LED 11 serving as component in the mobile telephone shown in FIG. 1, and FIG. 4 is an explanatory diagram showing an exemplary arrangement of the RGB tri-color LED shown in FIG. 3.

RGB tri-color LED 11 is equipped with red LED chip 22*a* arranged at the center of the surface of substrate 21, green LED chip 23*a* arranged to the right side of this red LED chip 22*a*, and blue LED chip 24*a* arranged to the left side of this red LED chip 22*a*.

Furthermore, red LED chip 22*a*, green LED chip 23*a*, and blue LED chip 24*a* are respectively arranged on the surface of substrate 21 by way of first frame 22*b*, second frame 23*b*, and third frame 24*b*. In addition, red LED chip 22*a* is die bonded to first frame 22*b*, green LED chip 23*a* is die bonded to second frame 23*b*, and blue LED chip 24*a* is die bonded to third frame 24*b*. Moreover, red LED chip 22*a* is wire bonded to fourth frame 22*c* by way of first Au lead (gold lead) 22*d*, green LED chip 23*a* is wire bonded to fifth frame 23*c* by way of second Au lead 23*d*, and blue LED chip 24*a* is wire bonded to sixth frame 24*c* by way of third Au lead 24*d*.

In addition, this substrate 21, this red LED chip 22*a*, this green LED chip 23*a*, this blue LED chip 24*a*, this first frame 22*b*, this second frame 23*b*, this third frame 24*b*, this fourth frame 22*c*, this fifth frame 23*c*, and this sixth frame 24*c* are packaged by means of encapsulating resin region 25 formed from phototransmissive resin. Arranged at side faces of this encapsulating resin region 25 there are first terminal 22*e* which is electrically connected to first frame 22*b*, second terminal 23*e* which is electrically connected to second frame 23*b*, third terminal 24*e* which is electrically connected to third frame 24*b*, fourth terminal 22*f* which is electrically connected to fourth frame 22*c*, fifth terminal 23*f* which is electrically connected to fifth frame 23*c*, and sixth terminal 24*f* which is electrically connected to sixth frame 24*c*.

Note that at FIG. 3, in order to more clearly show the structure at the interior of encapsulating resin region 25, that portion of encapsulating resin region 25 indicated as region A has been cut away in order to show substrate 21, red LED chip 22*a*, green LED chip 23*a*, blue LED chip 24*a*, first frame 22*b*, second frame 23*b*, third frame 24*b*, fourth frame 22*c*, fifth frame 23*c*, and sixth frame 24*c*.

Note also that whereas the present embodiment employs as LED an RGB tri-color LED 11 equipped with red LED chip 22*a*, green LED chip 23*a*, and blue LED chip 24*a* as shown in FIGS. 3 and 4, the mobile telephone of the present invention is not limited to this mode for carrying out same.

For example, the image captured by the camera may be monochromatic (black and white, sepia, etc.). In such a case, because the color(s) of the LED(s) used as light source need not be white or sepia, it being sufficient only that intensity of reflected light display differences in correspondence to shape and/or color of locations from which the light is reflected, the light source may, for example, be red or yellow. Moreover, this reflected light may be detected by a camera; the camera may output, to a monitor, a signal corresponding to the detected intensity of reflected light; and a black and white, sepia, or other such image may be displayed at the monitor in correspondence to the signal output from the camera.

Next, drivers for driving the RGB tri-color LED will be described with reference to the drawings.

Figure 5:
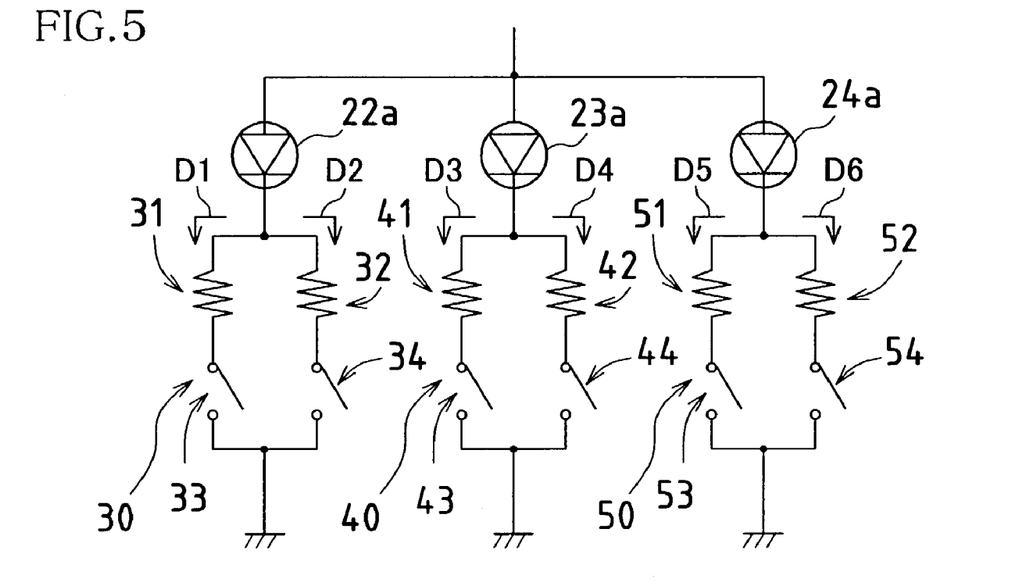
FIG. 5 is a circuit diagram showing an example of how the RGB tri-color LED shown in FIG. 3 may be connected.

The situation where red LED chip 22*a*, green LED chip 23*a*, and blue LED chip 24*a* at the interior of RGB tri-color LED 11 are connected in parallel will first be described.

FIG. 5 is a circuit diagram showing an example of how the RGB tri-color LED 11 shown in FIG. 3 may be connected.

The constitution here is such that the anode terminals of red LED chip 22*a*, green LED chip 23*a*, and blue LED chip 24*a* are connected in parallel to a power supply terminal, not shown, while red driver 30, green driver 40, and blue driver 50 are connected between ground and the respective cathode terminals thereof.

Red driver 30 comprises first resistor 31, second resistor 32, first switch 33, and second switch 34. More specifically, one end of first resistor 31 and one end of second resistor 32 are connected to the cathode terminal of red LED chip 22*a*, the other end of first resistor 31 is connected to one end of first switch 33, the other end of second resistor 32 is connected to one end of second switch 34, and the other end of first switch 33 and the other end of second switch 34 are grounded (i.e., are connected to ground).

Similarly, green driver 40 comprises third resistor 41, fourth resistor 42, third switch 43, and fourth switch 44. More specifically, one end of third resistor 41 and one end of fourth resistor 42 are connected to the cathode terminal of green LED chip 23*a*, the other end of third resistor 41 is connected to one end of third switch 43, the other end of fourth resistor 42 is connected to one end of fourth switch 44, and the other end of third switch 43 and the other end of fourth switch 44 are grounded (i.e., are connected to ground).

Similarly, blue driver 50 comprises fifth resistor 51, sixth resistor 52, fifth switch 53, and sixth switch 54. More specifically, one end of fifth resistor 51 and one end of sixth resistor 52 are connected to the cathode terminal of blue LED chip 24*a*, the other end of fifth resistor 51 is connected to one end of fifth switch 53, the other end of sixth resistor 52 is connected to one end of sixth switch 54, and the other end of fifth switch 53 and the other end of sixth switch 54 are grounded (i.e., are connected to ground).

Note that arrows D1 through D6 in the drawing indicate forward current.

Description will now be made taking the example of a case where red driver 30, green driver 40, and blue driver 50 are constructed in such fashion and in which a voltage of 5 V (volts) is applied to red driver 30, green driver 40, and blue driver 50 overall, driving of RGB tri-color LED 11 being controlled so as to cause a forward current of 40 mA (milliamperes) to respectively flow through red LED chip 22*a*, green LED chip 23*a*, and blue LED chip 24*a*, causing lighting of same, during flash use, and so as to cause a forward current of 20 mA to flow therethrough, causing lighting of same, during receipt of incoming call or calls.

That is, because when forward current is 20 mA the respective forward voltages across red LED chip 22*a*, green LED chip 23*a*, and blue LED chip 24*a* are 1.9 V for red LED chip 22*a*, and 3.85 V for green LED chip 23*a* and blue LED chip 24*a*, a voltage of 3.1 V will be applied across first resistor 31 and second resistor 32, and a voltage of 1.15 V will be applied across third resistor 41, fourth resistor 42, fifth resistor 51, and sixth resistor 52.

Accordingly, the values of the resistances at first resistor 31 and second resistor 32 are set to be 155Ω (=3.1÷0.02), and the values of the resistances at third resistor 41, fourth resistor 42, fifth resistor 51, and sixth resistor 52 are set to be 57.5Ω (=1.15÷0.02).

Furthermore, first switch 33, second switch 34, third switch 43, fourth switch 44, fifth switch 53, and sixth switch 54 are all turned ON when RGB tri-color LED 11 is used as flash, and emission of light in various patterns and colors is made to occur through combination of appropriately selected ON/OFF states when RGB tri-color LED 11 is used as incoming call indicator lamp.

Actual LED forward current—forward voltage characteristics normally being such that forward voltage across an LED chip gradually increases with increasing forward current, the voltages across the resistors in the aforementioned circuit structure may be expected to decrease in correspondence to same. Furthermore, such characteristics may be respectively different for the red LED chip 22*a*, green LED chip 23*a*, and the blue LED chip 24*a*. For example, where both the first resistor 31 and the second resistor 32 have been set to resistances calculated based on expected forward voltage when forward current is 20 mA, turning second switch 34 ON at a time when first switch 33 is already ON is liable to cause the current flowing through red LED chip 22*a* to rise above 20 mA. Because forward voltage would therefore rise above 1.9 V, causing the voltages applied across the two ends of each the first resistor 31 and the second resistor 32 to, conversely, drop below 3.1 V, forward current D1 would drop below 20 mA. Furthermore, because forward current D2 is equal to forward current D1, the current which represents the combination of the two would be less than the expected value of two times 20 mA; i.e., less than 40 mA. By rights, such increase in forward voltage with increasing forward current should therefore be taken into consideration when setting the value of the resistance of second resistor 32, but for convenience of description below it will be assumed that the forward voltages of the respective LED chips are constant over the range of forward currents (20 mA–60 mA) described herein.

For example, since turning first switch 33, second switch 34, third switch 43, fourth switch 44, fifth switch 53, and sixth switch 54 all ON will cause forward currents D1 through D6 to respectively be 20 mA, red LED chip 22*a* will light as a current of 40 mA flows therethrough, this representing combination of forward current D1 and forward current D2; green LED chip 23*a* will light as a current of 40 mA flows therethrough, this representing combination of forward current D3 and forward current D4; and blue LED chip 24*a* will light as a current of 40 mA flows therethrough, this representing combination of forward current D5 and forward current D6. As a result, RGB tri-color LED 11 will be lit with white color overall.

Furthermore, when first switch 33 and third switch 43 are turned ON and the other switches are all turned OFF, red LED chip 22*a* will light, a current of 20 mA flowing therethrough due to forward current D1, and green LED chip 23*a* will light, a current of 20 mA flowing therethrough due to forward current D3, but blue LED chip 24*a* will not light, since no current flows therethrough. As a result, RGB tri-color LED 11 will emit light of yellow color overall. Alternatively, when first switch 33 and fifth switch 53 are turned ON and the other switches are all turned OFF, red LED chip 22*a* will light, a current of 20 mA flowing therethrough due to forward current D1, green LED chip 23*a* will not light, and blue LED chip 24*a* will light, a current of 20 mA flowing therethrough due to forward current D5. As a result, RGB tri-color LED 11 will emit light of purple color overall.

Moreover, to change the magnitudes of the currents which respectively flow through red LED chip 22*a*, green LED chip 23*a*, and blue LED chip 24*a*, it is sufficient to change the values of the respective resistances at first resistor 31, second resistor 32, third resistor 41, fourth resistor 42, fifth resistor 51, and sixth resistor 52. By changing resistance values, it is possible to adjust white balance as determined by the color coordinates of red LED chip 22*a*, green LED chip 23*a*, and blue LED chip 24*a* when lit.

Furthermore, whereas in the foregoing description the values of the resistances at first resistor 31 and second resistor 32 were equal, and the values of the resistances at third resistor 41, fourth resistor 42, fifth resistor 51, and sixth resistor 52 were likewise all mutually equal, there is no limitation with respect hereto. By changing the value of the resistance at second resistor 32 so that it is less than the value of the resistance at first resistor 31, by changing the value of the resistance at fourth resistor 42 so that it is less than the value of the resistance at third resistor 41, and by changing the value of the resistance at sixth resistor 52 so that it is less than the value of the resistance at fifth resistor 51, it is possible to adjust the current which flows during flash use so that it is two or more times the current which flows during receipt of incoming call or calls. For example, by leaving the value of the resistance at first resistor 31 unchanged at 155Ω; changing the value of the resistance at second resistor 32 so that it is one-half of 155Ω, or 77.5Ω; leaving the values of the resistances at third resistor 41 and fifth resistor 51 unchanged at 57.5Ω; and changing the values of the resistances at fourth resistor 42 and sixth resistor 52 so that they are one-half of 57.5Ω, or 28.75Ω, forward currents D1, D3, and D5 will be unchanged at 20 mA, but forward currents D2, D4, and D6 will increase to two times 20 mA, which is to say they will increase to 40 mA. The current which flows during flash use will be the combination of forward current D1 and forward current D2 at red LED chip 22*a*, the combination of forward current D3 and forward current D4 at green LED chip 23*a*, and the combination of forward current D5 and forward current D6 at blue LED chip 24*a*, each of these combined currents respectively being 60 mA. In other words, the current which flows during flash use will increase to three times that which flows during receipt of incoming call or calls.

Furthermore, whereas in each of the foregoing situations described above, only one of the two switches in each of the banks of switches respectively corresponding to red LED chip 22*a*, green LED chip 23*a*, and blue LED chip 24*a* was selectively turned ON during receipt of incoming call or calls while both of the two switches in each of those banks of switches were turned ON during flash use, there is no limitation with respect hereto. For example, the circuit may be constituted such that only one of the two switches in each of the banks of switches is selectively turned ON during receipt of incoming call or calls, while only the other of the two switches in each of those banks of switches are all turned ON during flash use. Note however that in such a case it will be necessary to set resistance values so as to cause a larger current to flow during flash use than during receipt of incoming call or calls.

Moreover, a constant-current circuit may be employed in place of first resistor 31, second resistor 32, third resistor 41, fourth resistor 42, fifth resistor 51, and sixth resistor 52.

Figure 6:
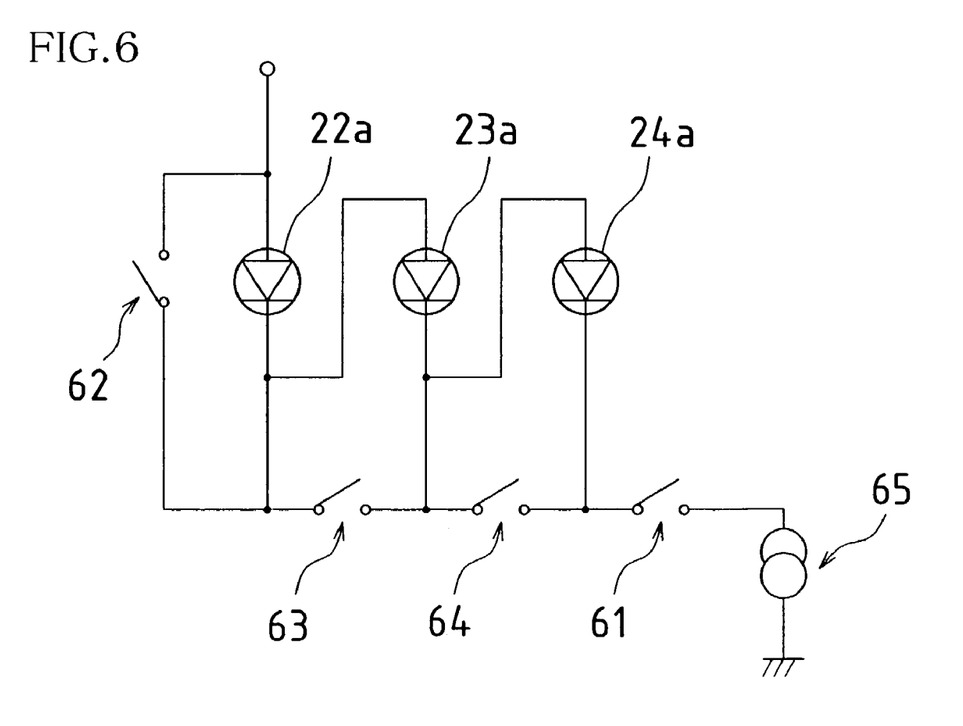
FIG. 6 is a circuit diagram showing another example of how the RGB tri-color LED shown in FIG. 3 may be connected.

Next, the situation where red LED chip 22a, green LED chip 23a, and blue LED chip 24a at the interior of RGB tri-color LED 11 are connected in series will be described.

FIG. 6 is a circuit diagram showing another example of how the RGB tri-color LED 11 shown in FIG. 3 may be connected.

Drivers employed in the present case comprise tri-color simultaneous control switch 61; single-color control switches represented by red control switch 62, green control switch 63, and blue control switch 64; and constant-current circuit 65.

Describing this in more specific detail, red LED chip 22a, green LED chip 23a, blue LED chip 24a, and tri-color simultaneous control switch 61 are connected in series between one or more power supplies and ground; red control switch 62 is connected in parallel to red LED chip 22a; green control switch 63 is connected in parallel to green LED chip 23a; and blue control switch 64 is connected in parallel to blue LED chip 24a. In addition, during receipt of incoming call or calls, RGB tri-color LED 11 emits light in prescribed pattern or patterns and in prescribed color or colors as a result of tri-color simultaneous control switch 61 being turned ON and as a result of red control switch 62, green control switch 63, and/or blue control switch 64 being turned ON in selectively combined fashion. During flash use, RGB tri-color LED 11 emits light as a result of only tri-color simultaneous control switch 61 being turned ON, with red control switch 62, green control switch 63, and blue control switch 64 all being turned OFF.

Where red LED chip 22a, green LED chip 23a, and blue LED chip 24a are connected in series in this fashion, constant-current circuit 65 may be employed in order to maintain constant current at the drivers. Moreover, provision of tri-color simultaneous control switch 61, red control switch 62, green control switch 63, and blue control switch 64 makes it possible to cause red LED chip 22a, green LED chip 23a, and blue LED chip 24a to be respectively lit in independent fashion.

In addition, if the constant-current circuit is made capable of switching between two or more current values, this will make it possible to control driving so as to cause intensity of light output from RGB tri-color LED 11 to be greater during flash use than during receipt of incoming call or calls. Moreover, this will also make it possible to set the value of the current which flows through RGB tri-color LED 11 when it is lit during flash use such that it is in accordance with sensitivity of the CCD and/or sensitivity of the C-MOS imager employed as camera 10 (see FIG. 1). Where a C-MOS imager is employed, the value of the current which flows through RGB tri-color LED 11 is typically set so as to obtain an illuminance of 20 lx (lux) at a location 50 cm from the light emitting portion of RGB tri-color LED 11.

Not only is it possible to cause the constant-current circuit to switch between or among different current values, but tri-color simultaneous control switch 61 may also, for example, be turned ON and OFF in periodic fashion so as to switch between or among periods and/or ON time durations, allowing the current which flows through red LED chip 22a, green LED chip 23a, and blue LED chip 24a to be switched between or among different periods and/or duty cycles. During use as incoming call indicator lamp, period might be set to achieve a low frequency, e.g. on the order of 10 Hz, and duty cycle might be set such that power is supplied for one-half of the period. On the other hand, during flash use, it is desirable that duty cycle be set such that there is a single pulse, this being on the same order as shutter speed, with the peak luminous intensity of the pulse being set to a high value. Because LED(s) is or are used, such LED(s) can be made to serve the functions of both incoming call indicator lamp and flash, and moreover, such LED(s) can be incorporated into the body of the mobile telephone.

The present invention may be embodied in a wide variety of forms other than those presented herein without departing from the spirit or essential characteristics thereof. The foregoing embodiments and working examples, therefore, are in all respects merely illustrative and are not to be construed in limiting fashion. The scope of the present invention being as indicated by the claims, it is not to be constrained in any way whatsoever by the body of the specification. All modifications and changes within the range of equivalents of the claims are moreover within the scope of the present invention.

Moreover, the present application claims right of benefit of prior filing date of Japanese Patent Application No. 2002-140398, the content of which is incorporated herein by reference in its entirety. Furthermore, all references cited in the present specification are specifically incorporated herein by reference in their entirety.

What is claimed is:

1. A mobile telephone equipped with one or more cameras,
   wherein said mobile telephone is further equipped with one light emitting diode that comprises one or more light emitting chip or chips; said light emitting diode being operable in a first mode wherein said light emitting diode is used to signal a telephone function, and in a second mode wherein said light emitting diode is used as a camera flash,
   wherein said one light emitting diode is an RGB tri-color light emitting diode having one or more red light emitting diode chips, one or more green light emitting diode chips, and one or more blue light emitting diode chips, and
   wherein said RGB tri-color light emitting diode lights in one or more prescribed patterns and in one or more prescribed colors as a result of selective combination of emission of light by at least one of the red light emitting diode chip or chips, at least one of the green light emitting diode chip or chips, and at least one of the blue light emitting diode chip or chips during receipt of incoming call or calls; and the RGB tri-color light emitting diode lights as a result of substantially simultaneous emission of light by at least one of the red light emitting diode chip or chips, at least one of the green light emitting diode chip or chips, and at least one of the blue light emitting diode chip or chips during flash use.

2. A mobile telephone according to claim 1, wherein said one light emitting diode is arranged on at least one face of the mobile telephone on at least one side thereof which is in at least one direction in which one or more photographs may be taken by at least one of the camera or cameras.

3. A mobile telephone according to claim 1, wherein said one light emitting diode serves as an incoming call indicator lamp.

4. A mobile telephone according to claim 1, wherein at least one of the red light emitting diode chip or chips, at least one of the green light emitting diode chip or chips, and at least one of the blue light emitting diode chip or chips are contained within a single package.

5. A mobile telephone according to claim 1, wherein at least one viewing angle of said light emitting diode is greater than at least one field angle of at least one of the camera or cameras.

6. A mobile telephone according to claim 1, wherein at least one lens is arranged to the front of at least one light emitting portion of said light emitting diode so as to cause illuminance of the light emitting diode to be uniform within at least one field angle of at least one of the camera or cameras.

7. A mobile telephone according to claim 1, wherein the current flowing through said RGB tri-color light emitting diode during flash use is greater than the current flowing through said RGB Tri-color light emitting diode during receipt of incoming call or calls.

8. A mobile telephone according to claim 1, wherein the current flowing through said RGB tri-color light emitting diode during flash use is greater than the current flowing through said light emitting diode in said first mode of operation.

9. A mobile telephone equipped with one or more cameras,
   wherein said mobile telephone is further equipped with one light emitting diode that comprises one or more light emitting chip or chips; said light emitting diode being operable in a first mode wherein said light emitting diode is used to signal a telephone function, and in a second mode wherein said light emitting diode is used as a camera flash,
   wherein said one light emitting diode is an RGB tri-color light emitting diode having one or more red light emitting diode chips, one or more green light emitting diode chips, and one or more blue light emitting diode chips, and
   wherein one end of at least one of the red light emitting diode chip or chips, one end of at least one of the green light emitting diode chip or chips, and one end of at least one of the blue light emitting diode chip or chips are connected in parallel to one or more power supplies; and one or more sets of two switches respectively connected in series to resistors are connected in parallel between ground and each of the other end of at least one of the red light emitting diode chip or chips, the other end of at least one of the green light emitting diode chip or chips, and the other end of at least one of the blue light emitting diode chip or chips; the RGB tri-color light emitting diode lighting in one or more prescribed patterns and in one or more prescribed colors as a result of the respective switches being switched ON in selectively combined fashion during receipt of incoming call or calls; and the RGB tri-color light emitting diode lighting as a result of substantially all of the switches being switched ON substantially simultaneously during flash use.

10. A mobile telephone equipped with one or more cameras,
   wherein said mobile telephone is further equipped with one light emitting diode that comprises one or more light emitting chip or chips; said light emitting diode being operable in a first mode wherein said light emitting diode is used to signal a telephone function, and in a second mode wherein said light emitting diode is used as a camera flash,
   wherein said one light emitting diode is an RGB tri-color light emitting diode having one or more red light emitting diode chips, one or more green light emitting diode chips, and one or more blue light emitting diode chips, and
   wherein at least one of the red light emitting diode chip or chips, at least one of the green light emitting diode chip or chips, at least one of the blue light emitting diode chip or chips, and one or more tri-color simultaneous control switches are connected in series between one or more power supplies and ground; one or more single-color control switches are respectively connected in parallel to at least one of the chip or chips of each color, the RGB tri-color light emitting diode lighting in one or more prescribed patterns and in one or more prescribed colors as a result of the tri-color simultaneous control switch or switches being switched ON and the respective single-color control switches being switched ON in selectively combined fashion during receipt of incoming call or calls; and the RGB Tri-color light emitting diode lighting as a result of only the tri-color simultaneous control switch or switches being switched ON during flash use.

11. A mobile telephone equipped with one or more cameras,
   wherein said mobile telephone is further equipped with one light emitting diode that comprises one or more light emitting chip or chips; said light emitting diode being operable in a first mode wherein said light emitting diode is used to signal a telephone function, and in a second mode wherein said light emitting diode is used as a camera flash,
   wherein said one light emitting diode is an RGB tri-color light emitting diode having one or more red light emitting diode chips, one or more green light emitting diode chips, and one or more blue light emitting diode chips, and
   wherein said one RGB tri-color light emitting diode operates in said first mode by emitting light in one or more prescribed patterns and in one or more prescribed colors from one or more selective combinations of a red light emitting diode chip, a green light emitting diode chip, or a blue light emitting diode chip to signal a telephone function, and said one RGB tri-color light emitting diode lights as a result of substantially simultaneous emission of light by at least one red light emitting diode chip, at least one green light emitting diode chip, and at least one blue light emitting diode chip in said second mode during flash use.

12. A mobile telephone equipped with one or more cameras,
   wherein said mobile telephone is further equipped with one light emitting diode that comprises one or more light emitting chip or chips; said light emitting diode being operable in a first mode wherein said light emitting diode is used to signal a telephone function, and in a second mode wherein said light emitting diode is used as a camera flash,
   wherein said one light emitting diode is an RGB tri-color light emitting diode having one or more red light emitting diode chips, one or more green light emitting diode chips, and one or more blue light emitting diode chips, and wherein each of said red light emitting diode chip or chips, said green light emitting diode chip or chips, and said blue light emitting diode chip or chips are connected on one end of each to one or more power supplies; and each of said red light emitting diode chip or chips, said green light emitting diode chip or chips, and said blue light emitting diode chip or chips are connected at the other end thereof to ground through at least two parallel circuit paths, each parallel circuit path including at least a switch connected in series to a resistance, said RGB tri-color light emitting diode operating in said first mode to signal a telephone function by lighting said red, green or blue light emitting diode chip in one or more prescribed patterns and in one or more prescribed colors as a result of a combination of less than all of said respective switches being switched ON in combined fashion and operating in said second mode as a result of substantially all of the switches being switched ON substantially simultaneously during flash use.

13. A mobile telephone equipped with one or more cameras, wherein said mobile telephone is further equipped with one light emitting diode that comprises one or more light emitting chip or chips; said light emitting diode being operable in a first mode wherein said light emitting diode is used to signal a telephone function, and in a second mode wherein said light emitting diode is used as a camera flash, wherein said one light emitting diode is an RGB tri-color light emitting diode having one or more red light emitting diode chips, one or more green light emitting diode chips, and one or more blue light emitting diode chips, and wherein at least one of the red light emitting diode chips, at least one of the green light emitting diode chips, at least one of the blue light emitting diode chips, and a tri-color simultaneous control switch are connected in series between a power supply and ground, and a plurality of single-color control switches are connected in parallel to said respective chips of each color, said RGB tri-color light emitting diode operating in said first mode to signal a telephone function by lighting in one or more prescribed patterns and in one or more prescribed colors as a result of switching ON of one or more, but less than all, of said single-color control switches, said RGB tri-color light emitting diode operating in said second mode by the tri-color simultaneous control switch being switched ON during flash use.

* * * * *